United States Patent [19]

Blackburn

[11] 4,405,903
[45] Sep. 20, 1983

[54] VARIOLOSSER FOR AN AUTOMATIC GAIN CONTROL CIRCUIT

[75] Inventor: Tom L. Blackburn, San Jose, Calif.

[73] Assignee: GTE Automatic Electric Incorporated, Northlake, Ill.

[21] Appl. No.: 248,659

[22] Filed: Mar. 27, 1981

[51] Int. Cl.³ .............................................. H03G 3/30
[52] U.S. Cl. .................... 330/284; 330/145; 307/559
[58] Field of Search ................ 330/145, 284; 307/552, 307/559, 565, 567; 455/249

[56] References Cited

U.S. PATENT DOCUMENTS 4,088,963  5/1978  Machida et al. ..................... 330/284

*Primary Examiner*—James B. Mullins
*Attorney, Agent, or Firm*—Leonard R. Cool

[57] ABSTRACT

A DC control current is developed in a first transistor circuit and the control current is responsive to a control voltage which is proportional to the output voltage of a fixed gain amplifier. A reference voltage is applied to a second transistor which provides the normal operating bias for said fixed gain amplifier, and, also, provides a variable impedance via the diode circuit of the base-emitter junction. This diode circuit is a part of a variolossor that also includes a resistor which is connected in the series path between the signal source and the fixed gain amplifier. The bias voltage of the second transistor does not change but the diode impedance varies as the control voltage varies so as to maintain the amplifier output constant.

4 Claims, 2 Drawing Figures

VARIOLOSSER FOR AN AUTOMATIC GAIN CONTROL CIRCUIT

BACKGROUND OF INVENTION

This invention relates to variable loss networks and in particular to such networks which are controlled by active circuit elements in response to an external control signal.

In a number of the prior art circuits, the output is controlled by controlling the gain of the output amplifier. A problem with such arrangements is that the gain may not be linear over the control range and further the impedance of the circuit output might change as the gain changes.

Other alternate ways which have been used to effect a constant output for a fixed gain amplifier, even though the input signal is varying over a fairly wide range, is to insert a variable impedance network between the input signal and the input to the fixed gain amplifier which impedance is responsive to the variations in the signal level. One such arrangement includes a resistor and a diode with the current through the diode varied in accordance with a control signal. The control signal is a direct current generated from a control device which is responsive to the output circuit voltage of the fixed gain amplifier. A disadvantage of such an arrangement is that the control current for the diode must be isolated both from the signal input circuit and from the input to the fixed gain amplifier. In addition the control current may become excessive. If the range of control is in the 60 dB range, for example, the control current can approach several milliamperes at high input levels. Further, a separate bias circuit is required for biasing the fixed gain amplifier and this adds to the current drain from the power source which can be a disadvantage in telecommunications circuits where low power can mean longer operating time in subscriber circuits where battery power is employed. These problems are solved by the circuit of the instant invention.

SUMMARY OF INVENTION

A variolosser comprises a control transistor which provides a dc control signal that is proportional to the output of a fixed gain amplifier, and a network which includes a bias transistor that provides the normal operating bias for said fixed gain amplifier. The current through the bias transistor is controlled by said control transistor and this, in turn, varies the impedance of the base-emitter junction. The variable impedance operates in conjunction with a resistor which is in series between the signal input of a signal source and a fixed gain amplifier so as to vary the loss experienced by the signal. This loss is such as to maintain the amplifier output substantially constant over a wide range of signal amplitudes from said signal source.

DETAILED DESCRIPTION

Figure 1:
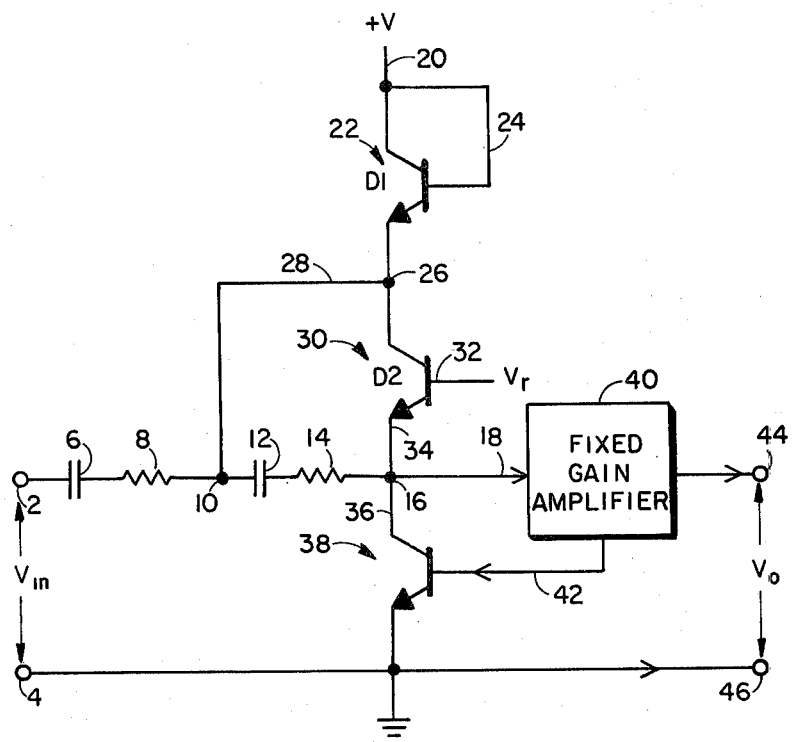
FIG. 1 is a schematic diagram showing an example of a two section variolosser circuit described in the instant invention.
Figure 2:
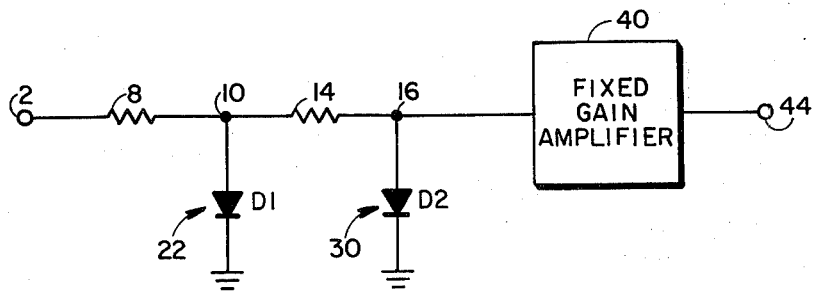
FIG. 2 is a representation of the AC equivalent circuit of the network shown in FIG. 1.

Referring now to FIG. 1, it may be seen that terminals 2 and 4 are arranged for receiving an input signal which is to be amplified by fixed gain amplifier 40. Because the input signal may vary over a wide range, a variolosser network is interposed between the signal input and the input to the fixed gain amplifier. The control circuit for the variolosser consists essentially of transistor 38 which has its base connected via path 42 to fixed gain amplifier 40. As is well known in the art, a signal proportional to the output of the fixed gain amplifier may be obtained and this signal is the one which is applied via path 42 to the base of transistor 38 thereby varying the bias of 38 so as to provide a control current having a magnitude which is proportional to the output of the fixed gain amplifier 40. A voltage supply (not shown) applies a positive voltage $+V$ to path 20 which is connected to the collector of transistor 22. Transistor 22 is connected in a diode configuration and provides the variable element for the first stage of the variolosser circuit. The emitter is connected to the collector of transistor 30 and via junction 26 and path 28 to junction 10 which is connected to one terminal end of resistor 8. Referring to FIG. 2 it may be seen that the combination of resistor 8 and transistor D1 provide a voltage divider circuit which permits variation in the loss of the input signal provided between paths 2 and 4, as shown in FIG. 1. Capacitors 6 and 12 block the dc current from an ac input circuit.

Transistor 30 performs two different functions. First, using a reference voltage $V_r$ at the base input on path 32, the transistor provides the bias voltage for the fixed gain amplifier 40. The reference voltage may be obtained from a reference voltage source in the circuit in which this variolosser network is to be employed or it may be derived from a battery. It may also be obtained from a resistor divider connected between $+V$ and ground with the junction of the divider providing $V_r$. To obtain maximum swing, $V_r$ should be about $\frac{1}{2} +V$, although other smaller values are practical. In addition to providing the bias for the fixed gain amplifier, transistor 30 base-emitter diode junction provides the variable impedance element for the second stage of the variolosser circuit. This is illustrated in FIG. 2 by the arrangement of resistor 14 and transistor 30 which form a second voltage divider circuit following the first voltage divider circuit comprising resistor 8 and transistor 22 shown here as diode D1.

As noted above, the bias voltage applied to the base-emitter junction of transistor 38 is variable depending upon the variation in input to the fixed gain amplifier. This variation in bias voltage to the transistor 38 causes the control current which flows through transistors 22, 30 and 38 to vary in proportion thereto and thus vary the resistances of the diode elements used in conjunction with resistors 8 and 14 so as to increase or decrease the loss in the circuit in order that the output available at terminals 44 and 46 from the fixed gain amplifier 40 will be substantially constant.

Other modifications of the circuit shown in FIG. 1 may be employed. For example, a single stage variolosser can be obtained by removing capacitor 6, resistor 8, lead 28 and transistor 22. Also the number of sections can be increased. Each section must be isolated from the others. For example, the collector of D2 isolates itself and thus node 26 from D1. If three sections are to be employed, the reference voltage could be connected to D2 as shown in FIG. 1, but a third transistor D3 would be interposed between D2 and transistor 38. Base reference for D3 could be obtained using a diode between the base of D2 and the base of D3. A by-pass capacitor would be connected between the baase of D3 and ground. A third capacitor and resisotr would be connected in series between the D1–D2 networks and the fixed gain amplifier 40. i.e., between resistor 14 and junction 16. Other changes will occur to those of ordinary skill in the art. While the invention has been particularly shown and described with reference to a preferred embodiment thereof, it will be understood that those skilled in the art may make changes in form and detail without departing from the spirit and scope of the invention.

What is claimed is:

1. In an automatic gain control circuit, a variolosser interposed between a signal and a fixed gain amplifier for maintaining a substantially constant output level from the latter, comprising:

first means for electrically connecting at least a pair of DC impedance elements in series with an input terminal of the amplifier;

second means for developing a control voltage that is proportional to the output voltage of the amplifier;

a first transistor responsive to said control voltage for developing a control current that is proportional to said output voltage;

a supply voltage source;

a reference voltage source; and a network including at least a second transistor and a diode means, which is a variable impedance element, having their primary conduction paths electrically connected in series with the primary conduction path of said first transistor across said supply voltage source for passing the control current, and third means for electrically connecting a first junction, that is between said diode means and said second transistor, to a second junction, which is between said pair of DC impedance elements; said second transistors base and emitter being electrically connected to said reference voltage source and to one of said first transistors emitter and collector, respectively; said second transistor providing bias voltage for said fixed gain amplifier, with the base-emitter portion thereof also operating as a variable impedance element in said network, whereby the output of the amplifier is maintained constant over a wide range of input signals to said network.

2. The variolosser as set forth in claim 1 wherein said first means comprises:

a first series combination of a first capacitor and a first one of said DC impedance elements, which is a resistive element, electrically connected between said second junction and the input terminal of the amplifier; and a second series combination of a second capacitor and a second one of said DC impedance elements, which is a resistive element, having one side electrically connected to said second junction and having the other side of said second series combination adapted for connection to the signal source.

3. A variolosser as set forth in claim 2 wherein said diode means is a diode connected transistor.

4. A variolosser as set forth in claim 3 wherein said first transistor has a collector electrode electrically connected to the emitter of said second transistor, has an emitter electrically connected to a common terminal of said supply voltage source, and a base electrode receiving the control voltage signal from the amplifier.

* * * * *